(12) United States Patent
Gonohe et al.

(10) Patent No.: US 8,796,142 B2
(45) Date of Patent: Aug. 5, 2014

(54) METHOD FOR FORMING TANTALUM NITRIDE FILM

(75) Inventors: Narishi Gonohe, Shizuoka-ken (JP);
Satoru Toyoda, Shizuoka-ken (JP);
Harunori Ushikawa, Shizuoka-ken (JP);
Tomoyasu Kondo, Shizuoka-ken (JP);
Kyuzo Nakamura, Kanagawa-ken (JP)

(73) Assignee: Ulvac, Inc., Kanagawa (JP)

( * ) Notice: Subject to any disclaimer, the term of this patent is extended or adjusted under 35 U.S.C. 154(b) by 562 days.

(21) Appl. No.: 11/885,345

(22) PCT Filed: Mar. 3, 2006

(86) PCT No.: PCT/JP2006/004072
§ 371 (c)(1),
(2), (4) Date: Nov. 19, 2008

(87) PCT Pub. No.: WO2006/093262
PCT Pub. Date: Sep. 8, 2006

(65) Prior Publication Data
US 2009/0104775 A1    Apr. 23, 2009

(30) Foreign Application Priority Data
Mar. 3, 2005  (JP) ................................. 2005-059085

(51) Int. Cl.
*H01L 21/44*  (2006.01)

(52) U.S. Cl.
USPC ........... 438/680; 438/648; 438/686; 118/715; 427/248.1

(58) Field of Classification Search
None
See application file for complete search history.

(56) References Cited

U.S. PATENT DOCUMENTS 5,893,752 A * 4/1999 Zhang et al. ............... 438/687
6,139,922 A * 10/2000 Kaloyeros et al. ......... 438/758
(Continued)

FOREIGN PATENT DOCUMENTS

JP    10-135155 A    5/1998
JP    2002-26124    1/2002
(Continued)

OTHER PUBLICATIONS

Gladczuk, Leszek et al., "Sputter deposition of bcc tantalum films with TaN underlayers for protection of steel", Thin Solid Films vol. 476, Nov. 19, 2004, pp. 295-302.
(Continued)

*Primary Examiner* — Julio J Maldonado
*Assistant Examiner* — Joseph Galvin, III
(74) *Attorney, Agent, or Firm* — Arent Fox LLP

(57) ABSTRACT

A tantalum nitride film rich in tantalum atoms is formed by simultaneously introducing a raw gas consisting of a coordination compound of elemental tantalum (Ta) having a coordinated ligand of formula: N=(R, R') (wherein, R and R' each represents an alkyl group having 1 to 6 carbon atoms) and $NH_3$ gas into a film-forming chamber; reacting the raw gas with the $NH_3$ gas; forming a reduced compound having Ta—$NH_3$ on a substrate; and introducing a hydrogen atom-containing gas into the chamber to form a tantalum nitride film rich in tantalum atoms. The resulting tantalum nitride film has a low resistance, low contents of C and N atoms, and a high compositional ratio: Ta/N, show sufficiently high adherence to Cu film and can thus be useful as a barrier film. Moreover, tantalum particles are implanted in the resulting film according to the sputtering technique to further enrich the film with tantalum.

7 Claims, 2 Drawing Sheets

(56) References Cited

U.S. PATENT DOCUMENTS

| | | | |
|---|---|---|---|
| 6,376,371 B1* | 4/2002 | Jain et al. | 438/681 |
| 6,398,929 B1 | 6/2002 | Chiang et al. | |
| 2003/0082307 A1 | 5/2003 | Chung et al. | |
| 2003/0124262 A1* | 7/2003 | Chen et al. | 427/404 |
| 2004/0144311 A1* | 7/2004 | Chen et al. | 118/715 |
| 2004/0219784 A1* | 11/2004 | Kang et al. | 438/653 |
| 2005/0106865 A1* | 5/2005 | Chung et al. | 438/685 |
| 2006/0113603 A1* | 6/2006 | Currie | 257/368 |
| 2008/0142971 A1* | 6/2008 | Dordi et al. | 257/751 |

FOREIGN PATENT DOCUMENTS

| | | |
|---|---|---|
| JP | 2003-342732 A | 12/2003 |
| JP | 2005-203569 A | 7/2005 |
| KR | 2001-50926 A | 6/2001 |
| KR | 2002-10615 A | 2/2002 |
| WO | WO 00/65125 A1 | 11/2000 |

OTHER PUBLICATIONS

Cho, Kwang-Nam et al., "Remote Plasma-Assisted Metal Organic Chemical Vapor Deposition of Tantalum Nitride Thin Films with Different Radicals," Jpn.J.Appl.Phys., 1998, vol. 37, pp. 6502-6505.

Park, Seoung Gon et al., "Stability of Plasma Posttreated TiN Films Prepared by Alternating Cyclic Pulses of Tetrakis-Dimethylamido-Titanium and Ammonia," Jpn.J.Appl.Phys., 2004, vol. 43, pp. 303-304.

Official Action issued Aug. 30, 2012 in Taiwanese patent application No. 095106826.

* cited by examiner

METHOD FOR FORMING TANTALUM NITRIDE FILM

CROSS-REFERENCE TO RELATED APPLICATION

This application is a National Stage entry of International Application Number PCT/JP2006/304072, filed Mar. 3, 2006. The disclosure of the prior application is hereby incorporated herein in its entirety by reference.

TECHNICAL FIELD

The present invention relates to a method for forming a tantalum nitride film and, in particular, to a method for forming, according to the CVD technique, a tantalum nitride film useful as a barrier film for distributing wire-forming film or electrical connection-forming films.

BACKGROUND ART

Recently, there has increasingly been desired for the development of a technique which permits the more finely processing step with respect to the thin film-forming technique used in the field of the semiconductor and this results in the occurrence of a variety of related problems.

In an example of the technique for forming electrical connections of a thin film in a semiconductor device, copper has mainly be used as a material for the electrical connection because of its low resistivity. However, it is technically difficult to etch copper and copper may easily penetrate or diffuse into the underlying layer such as an insulating film and accordingly, a problem arises such that the reliability of the resulting device is lowered.

To solve this problem, such diffusion of the copper has conventionally been prevented by forming a metal thin film (or a conductive barrier film) on the inner wall surface of the interlayer-connecting holes in a multi-layered electrical connection structure according to, for instance, the CVD technique; and then forming a layer for making the electrical connections by the application of a copper thin film on the conductive barrier film so that the resulting copper thin film never comes in direct contact with the underlying insulating film such as a silicon oxide film (see, for instance, Japanese Un-Examined Patent Publication 2002-26124 (Claims and the like)).

In this case, it has been required that fine contact holes, trenches or the like each having a high aspect ratio should be plugged or filled up with a thin barrier film while ensuring a high rate of step-coverage, in response to the foregoing demands for the use of electrical connections having a multi-layered structure and a further miniaturized pattern.

DISCLOSURE OF THE INVENTION

Problems that the Invention is to Solve

In the case of the foregoing conventional technique, a problem arises, such that it is difficult to form a tantalum nitride (TaN) film having a low resistance and useful as a barrier layer, according to a CVD technique, while ensuring the adherence to the Cu film used for forming electrical connections. To solve this problem, it would be necessary to develop a film-forming process which can eliminate organic groups such as alkyl groups present in the raw gas used in the process through the cleavage thereof, which can thus reduce the content of C atoms and simultaneously break the linkages between Ta and N and which can thus increase the compositional ratio: Ta/N.

Accordingly, it is an object of the present invention to solve the foregoing problems associated with the conventional techniques and more specifically to provide a method for forming a tantalum nitride film, according to the CVD method, which has a low resistance, whose contents of C and N atoms are low, which has a high compositional ratio: Ta/N, which can ensure sufficiently high adherence to the electrical connection-forming film (such as Cu electrical connection-forming film) and which is thus useful as a barrier film.

Means for Solving the Problems

The tantalum nitride film-forming method according to the present invention comprises the steps, according to the CVD technique, of introducing a raw gas consisting of a coordination compound constituted by an elemental tantalum (Ta) having a coordinated ligand represented by the general formula: $N=(R, R')$ (in the formula, R and R' may be the same or different and each represents an alkyl group having 1 to 6 carbon atoms) and $NH_3$ gas into a film-forming chamber or a vacuum chamber, reducing the raw gas (the coordination compound) with the $NH_3$ gas and forming a reduced compound film on a substrate to thus partially remove the R(R') groups bonded to N atoms in the resulting reduced compound film through cleavage; and then introducing a hydrogen atom-containing gas into the chamber, and reacting the hydrogen atom-containing gas with the reduced compound film to thus break Ta—N bonds of Ta—N—$NH_x$ present in the reduced compound film, to remove the R(R') groups, which are bonded to N atoms, remaining in the film through cleavage, and to thus form a tantalum nitride film rich in tantalum atoms. In this respect, if the number of carbon atoms included in the foregoing coordination compound exceeds 6, a problem arises such that the carbon content of the resulting film increases.

The H atom-containing gas is converted into radicals thereof by the action of heat or plasma within the film-forming chamber and the resulting radicals are reacted with the reduced compound film to thus form a tantalum nitride film rich in tantalum atoms.

The method comprising the foregoing steps permits the formation of a tantalum nitride film which has a low resistance, whose contents of C and N atoms present in the resulting film are reduced, which has a high compositional ratio: Ta/N, which can ensure sufficiently high adherence to the electrical connection-forming film (such as a Cu electrical connection-forming film) and which is thus useful as a barrier film.

It is preferred that the foregoing raw gas is the gas of at least one coordination compound selected from the group consisting of penta-dimethylamino-tantalum (PDMAT), tert-amylimido-tris(dimethylamide) tantalum (TAIMATA), penta-diethyl-amino-tantalum (PEMAT), tert-butylimido-tris(dimethylamide) tantalum (TBTDET), tert-butyl-imido-tris(ethyl-methylamide) tantalum (TBTEMT), $Ta(N(CH_3)_2)_3(NCH_2 CH_3)_2$ (DEMAT) and $TaX_5$ (X represents a halogen atom selected from chlorine, bromine and iodine).

The hydrogen atom-containing gas is desirably at least one member or gas selected from the group consisting of $H_2$, $NH_3$ and $SiH_4$ gases.

The foregoing tantalum nitride film-forming method would permit the formation of a low-resistant tantalum nitride film enriched with tantalum, which satisfies the following requirement: the compositional ratio of tantalum to nitrogen in the film: Ta/N≥2.0.

According to the present invention, there is also provided a method for forming a tantalum nitride film which comprises the steps of forming a tantalum nitride film according to the foregoing method; and then implanting tantalum particles into the resulting tantalum nitride film according to the sputtering technique which makes use of a target containing tantalum as the principal constituent. The method would permit the formation of a tantalum nitride film which is further rich in tantalum and which sufficiently satisfies the following requirement: the compositional ratio of tantalum to nitrogen in the film: Ta/N≥2.0.

The sputtering step is desirably carried out while controlling the DC power and the RF power in such a manner that the DC power is low, while the RF power is high.

Effects of the Invention

The present invention thus permits the formation of a tantalum nitride film, according to the CVD technique, which has a low resistance, whose contents of C and N atoms are low, which has a high compositional ratio: Ta/N, which can ensure sufficiently high adherence to the electrical connection-forming film (such as Cu electrical connection-forming film) and which is thus useful as a barrier film.

The present invention also permits the formation of a tantalum nitride film which is further enriched with tantalum by the implantation of tantalum in the tantalum nitride film, which is formed according to the foregoing CVD technique, by the PVD technique such as the sputtering method.

In addition, the present invention likewise permits the formation of an electrical connection-forming film on the foregoing barrier film, with excellent adherence to the latter and good evenness.

BEST MODE FOR CARRYING OUT THE INVENTION

According to the present invention, a low-resistant tantalum nitride film having low contents of C and N atoms, a high compositional ratio: Ta/N, may be obtained, according to the CVD technique such as the thermal or plasma enhanced CVD technique, by reacting the raw gas consisting of the foregoing tantalum-containing coordination compound with $NH_3$ gas on a substrate placed in a vacuum chamber serving as a film-forming chamber to thus form a film of a reduced compound having Ta—N—$NH_x$ bonds on the substrate and then reacting the reduced compound with radicals generated by activating an H atom-containing gas introduced into the vacuum chamber by the action of heat or plasma, i.e. radicals such as H radicals derived from $H_2$ gas or $NH_3$ gas and $NH_x$ radicals derived from $NH_3$ gas.

The raw gas, $NH_3$ gas and the hydrogen atom-containing gas such as those listed above may directly be introduced into the vacuum chamber or they may likewise be introduced into the same in combination with an inert gas such as $N_2$ gas or Ar gas. Regarding the amounts of these reactants, relative to the raw gas, it is desirable that the $NH_3$ gas be used, for instance, at a flow rate ranging from about 100 to 1000 sccm per 5 sccm of the raw gas, while the hydrogen atom-containing gas be used, for instance, at a flow rate ranging from 100 to 1000 sccm (amount converted to that of $H_2$) per 5 sccm of the raw gas.

The reaction temperature used in the foregoing two reactions is not restricted to any specific one insofar as it can initiate these reactions and, for instance, it is in general not more than 300° C. and preferably 150 to 300° C. for the reduction reaction of the raw gas with the $NH_3$ gas; and it is in general not more than 300° C. and preferably 150 to 300° C. for the reaction of the product of the foregoing reduction reaction with the radicals. In addition, it is desirable that the pressure in the vacuum chamber ranges from 1 to 100 Pa for the initial reduction reaction and that it ranges from 1 to 100 Pa for the subsequent film-forming reaction.

As has been discussed above, the coordination compound is one constituted by an elemental tantalum (Ta) having a coordinated ligand represented by the general formula: N═(R, R') (in the formula, R and R' may be the same or different and each represents an alkyl group having 1 to 6 carbon atoms). The alkyl group may be, for instance, a linear or branched one such as a methyl, ethyl, propyl, butyl, pentyl or hexyl group. The coordination compound is in general one constituted by an elemental tantalum (Ta) having 4 or 5 coordinated ligands represented by the formula: N—(R, R').

The foregoing method of the present invention may be carried out by, for instance, introducing a raw gas and an $NH_3$ gas into a vacuum chamber serving as a film-forming chamber to reduce the raw gas with the latter gas to thus form a film composed of a reduced compound having Ta—N—$NH_x$ bonds according to the CVD technique; and then introducing a hydrogen atom-containing compound gas into the chamber and reacting radicals derived from the hydrogen atom-containing compound gas by the action of heat or plasma with the foregoing reduced product to thus form a tantalum nitride film; and thereafter the process may be repeated over predetermined times, or the foregoing reduction reaction may be repeated over desired times and then the reduction product may be reacted with the radicals.

The tantalum nitride film-forming method of the present invention may be carried out using any film-forming apparatus inasmuch as the apparatus permits the practice of the so-called CVD technique. For instance, an embodiment of the method of the present invention will hereunder be described in detail while using the plasma CVD film-forming apparatus as shown in FIG. 1.

The plasma CVD apparatus as shown in FIG. 1 comprises a vacuum chamber 1 serving as a film-forming chamber, a vacuum evacuation system 2 is connected to the side wall of the vacuum chamber and an electrode 3 is arranged above the vacuum chamber in a state insulated from the chamber. A high frequency power source 4 is connected to the electrode 3 and arranged at the exterior of the chamber 1 so that a high frequency power can be applied to the electrode to thus generate plasma within the vacuum chamber. A stage 6 for placing a substrate provided with a built-in heating means 5 such as a heater is positioned below or at the lower part of the vacuum chamber and is disposed in such a manner that the substrate-mounting face thereof is horizontal with and opposed to the electrode face.

The electrode 3 is provided with a gas chamber 7 therein and a plurality of holes 8 serving as shower nozzles are formed on the face thereof opposite to the substrate-mounting stage 6, or the electrode is so designed that a gas is introduced into the vacuum chamber through the holes to thus supply the gas onto the substrate surface and accordingly, this electrode may serve as a shower plate.

The gas chamber 7 is connected to one end of a gas-introducing system 9 and the other end of the gas-introducing system is connected to a plurality of bombs (not shown) each filled with, for instance, the raw gas, the $NH_3$ gas or the hydrogen atom-containing gas. In this case, the gas chamber 7 may be connected to a plurality of gas-introducing systems 9 connected to separate bombs respectively. The apparatus is so designed that the flow rate of each gas can be controlled with a mass flow controller, although this is not clearly shown in this figure.

In addition to the introduction of the raw gas into the vacuum chamber using a gas bomb filled with the raw gas, it is also possible to accommodate the foregoing tantalum-containing organometal compound in a container which has been heated and maintained at a desired temperature, supply an inert gas such as Ar gas as a bubbling gas to the container through, for instance, a mass-flow controller for the sublimation thereof and to thus introduce the sublimated raw gas together with the bubbling gas into the vacuum chamber; or alternatively, the raw gas, which has been vaporized through a vaporizer, may likewise be introduced into the vacuum chamber.

The following is the description of an embodiment of the tantalum nitride film-forming method according to the present invention which is carried out using the plasma-enhanced CVD type film-forming apparatus as shown in FIG. 1.

First of all, the vacuum evacuation system 2 is put into operation to evacuate the vacuum chamber 1 to a predetermined pressure (for instance, $10^{-4}$ to $10^{-5}$ Pa), a substrate S is placed on the substrate-mounting stage 6 and then the heating means 5 is switched on to heat the substrate to a desired temperature (for instance, a temperature ranging from 150 to 300° C.). Then a raw gas and an $NH_3$ gas are introduced into the gas chamber 7 through the gas-introducing system 9 and supplied towards the surface of the substrate S through the holes 8. The substrate S is not restricted to any particular one, but it may be any known one which is provided with an underlying adhesive layer on the insulating layer and whose surface has been subjected to a pre-treatment such as a degassing treatment.

After establishing a predetermined stable pressure in the vacuum chamber 1, a high frequency power source 4 is put into operation to thus make, output, a high frequency AC voltage having a frequency of 27.12 MHz and a power density of 0.2 $W/cm^2$. When this AC voltage is applied to the electrode 3 through the high frequency power source, the plasma of the raw gas and the $NH_3$ gas or $NH_x$ radicals (such as those derived from $NH_3$ gas) is generated between the electrode 3 which is so designed as to function as a cathode and the surface of the substrate S placed on the substrate holder 6 which is so designed as to function as an anode. The radicals of these raw gas and $NH_3$ gas are generated within the plasma and a reducing reaction takes place on the surface of the substrate S and this results in the formation of a film composed of a reduced compound having Ta—N—$NH_3$ bonds on the substrate. After the formation of the reduced compound film having a desired film thickness, the high frequency power source 4 is switched off and the supply of the raw gas and the $NH_3$ gas is stopped.

Then, a hydrogen atom-containing gas is introduced into the vacuum chamber 1 through the gas-introducing system 9 to thus carry out the activation of the gas. More specifically, the procedures similar to those used above are repeated to thus generate plasma of these gases within the chamber, the radicals thereof generated within the plasma are incident upon the surface of the reduced compound film formed above to thus make them react with one another. This leads to the breakage of the Ta—N bonds present in the reduced compound film through cleavage, the removal of the R(R') groups, which is bonded to an H atom, remaining in the film through the cleavage thereof and the formation of a tantalum nitride film rich in tantalum. After the formation of a tantalum nitride film having a desired film thickness, the high frequency power source 4 is switched off, the introduction of the hydrogen atom-containing gas is stopped and the substrate S is withdrawn from the vacuum chamber 1.

The tantalum nitride film thus formed according to the foregoing method was analyzed by the AES and as a result, the following results were obtained: the content of C: not more than 5%; the content of N: 33 to 35%; the ratio: Ta/N: 1.9 to 2.0; and the resistivity of not more than 600μΩ·cm.

As has been described above, the reactant gases such as the $NH_3$ gas and the hydrogen atom-containing gas are activated in the plasma according to the plasma enhanced CVD technique and therefore, a thin film can be formed even at a relatively low film-forming temperature. Moreover, a tantalum nitride film rich in tantalum can likewise be prepared by the same procedure using the known process conditions according to the thermal CVD technique.

The substrate, on which a tantalum nitride film having a desired thickness has been formed by the foregoing method, may further be treated, if necessary, by applying a voltage to a target, while using a sputtering gas such as Ar gas, to thus generate plasma and sputter the target according to the usual sputtering technique to thus form a metal thin film or an adhesive layer on the side of an electrical connection-forming film (an underlying layer on the side of the barrier film), on the surface of the foregoing tantalum nitride film.

A laminated film is formed on the substrate S through the foregoing steps. Subsequently, the electrical connection-forming film (such as Cu-electrical connection-forming film) is formed on the foregoing adhesive layer on the side of the electrical connection-forming film, according to a known method.

Incidentally, in the method for preparing a tantalum nitride film according to the present invention, it is necessary to carry out a known degassing treatment for the removal of impurities such as gases adhered to the surface of the substrate S prior to the formation of such a barrier film, and an electrical connection-forming film of, for instance, Cu is finally formed after such a barrier film is applied onto the substrate. For this reason, if this film-forming apparatus is incorporated into a composite type electrical connection film-forming apparatus which is so designed that the film-forming apparatus is connected to at least the degassing chamber and an electrical connection film-forming chamber through a conveying chamber capable of being evacuated to a vacuum and that a transportation robot can convey the substrate from the conveying chamber to the film-forming chamber, the degassing chamber and the electrical connection film-forming chamber, a series of steps extending from the pre-treatment step to the electrical connection film-forming step can be implemented in this apparatus.

Tantalum particles are implanted in the tantalum nitride film thus formed according to the PVD technique such as the sputtering technique to be able to thus form a tantalum nitride film further rich in tantalum. For instance, this may be carried out using a known sputtering device wherein a target is positioned upper portion of the vacuum chamber and arranged at the position opposite to the substrate holder.

In the case of such a sputtering device, the target is connected to an electric voltage-applying device for generating plasma which can sputter the surface of the target to thus emit particles composed of the constituent of the target. The target used herein is one mainly comprising the metal constituent element (Ta) of the foregoing raw gas and the electric voltage-applying device is constituted by a high frequency-generating device and an electrode connected to the target. In this respect, it is sufficient to use, as the sputtering gas, a known inert gas such as argon gas or xenon gas.

Then, after placing, in the sputtering chamber, the substrate on which the tantalum nitride film serving as a barrier layer is formed by the foregoing method, an inert gas such as Ar gas is introduced into the sputtering chamber while inducing discharges to thus sputter the target mainly comprising tantalum as a constituent component of the raw gas and to implant tantalum particles as the sputtering particles in the thin film formed on the substrate. Thus, tantalum originated from the target can be implanted in the thin film on the surface of the substrate according to the sputtering technique and therefore, the content of tantalum in the barrier film can further be increased to thus give a tantalum nitride film rich in tantalum and having a desired low resistance value. In this respect, as the raw gas is an organic tantalum compound, the decomposition thereof is accelerated and impurities such as C and N are expelled from the barrier layer when the constituent element (tantalum) is incident upon the surface of the substrate according to the foregoing sputtering technique and as a result, this results in the formation of a low resistant barrier film having a quite low content of impurities.

This sputtering operation is not carried out for the formation of a laminated tantalum film, but for the implantation of tantalum particles in the tantalum nitride film through the bombardment thereof to remove C and N through sputtering and to improve the quality of the film. Accordingly, it is needed that this sputtering must be performed under such conditions that any tantalum film is not formed or they permit the etching of the tantalum nitride film with tantalum particles. To this end, it would, for instance, be necessary that the sputtering step is carried out while controlling the DC power and the RF power in such a manner that the DC power is low and the RF power is high. For instance, such sputtering conditions which are never accompanied by the formation of any tantalum film can be established when the DC power is set at a level of not more than 5 kW, while the RF power is set at a high level, for instance, a value ranging from 400 to 800 W. In this connection, the RF power is dependent upon the DC power and therefore, these DC and RF powers are appropriately adjusted so as to control the extent of the improvement of the film quality. In addition, the sputtering temperature may be one usually adopted and it may, for instance, be one identical to that used for the formation of the tantalum nitride film.

After the formation of such a barrier film having a desired thickness on the foregoing substrate S according to the foregoing procedures, it is, if necessary, also possible that a sputtering gas such as Ar gas is introduced into the chamber and a voltage is applied to the target by putting the voltage-applying device into operation to thus generate plasma and then the target is sputtered according to any known sputtering technique to thus form a metal thin film or an adhesive layer on the side of the electrical connection-forming film (an underlying layer on the barrier film side) on the surface of the foregoing barrier film.

A laminated film is thus formed on the substrate S through the foregoing steps. Subsequently, the electrical connection-forming film is formed on the foregoing adhesive layer on the side of the electrical connection-forming film according to any known method.

FIG. 2 is a schematic diagram showing the structure of a composite type electrical connection film-forming apparatus equipped with the film-forming apparatus as shown in FIG. 1.

This composite type electrical connection film-forming apparatus 100 is composed of a pre-treatment section 101, a film-forming section 103 and a relay section 102 connecting these sections. Either of these sections should be maintained under desired vacuum atmospheric conditions prior to the implementation of each treatment.

First of all, in the pre-treatment section 101, a substrate free of any treatment and arranged in a transfer chamber 101a is introduced into a degassing chamber 101c by putting, into operation, a conveyer robot 101b for the pre-treatment section. The un-treated substrate is heated in the degassing chamber 101c to thus subject the substrate to a degassing treatment by, for instance, the evaporation of the moisture present on the surface thereof. Then the degassed substrate is transferred to a reduction-treating chamber 101d by the action of the conveyer robot 101b. In this reduction-treating chamber 101d, the substrate is subjected to an annealing treatment in which the substrate is heated while supplying a reducing gas such as hydrogen gas to the chamber to thus remove metal oxides of the underlying electrical connections through the reduction.

After the completion of the annealing treatment, the substrate is withdrawn from the reduction-treating chamber 101d and then transferred to the relay section 102 by the action of the conveyer robot 101b. The substrate is then delivered to a conveyer robot 103a for the film-forming section 103 in the relay section 102.

The substrate thus delivered to the conveyer robot 103a is then introduced into a film-forming chamber 103b by the action of the robot 103a. This film-forming chamber 103b corresponds to the film-forming apparatus 1 described above. In the film-forming chamber 103b, a barrier film and an adhesive layer are formed on the substrate as a laminate film, the substrate provided thereon with the laminate film is then withdrawn from the film-forming chamber 103b and introduced into an electrical connection film-forming chamber 103c by the action of the conveyer robot 103a, in which an electrical connection-forming film is applied onto the foregoing barrier film (or onto the adhesive layer, if an adhesive layer is formed on the barrier film). After the formation of the electrical connection-forming film, the substrate is transferred from the electrical connection film-forming chamber 103c to a transfer chamber 103d by putting the conveyer robot 103a into operation. Thereafter, the substrate is withdrawn from the transfer chamber 103d.

As has been discussed above in detail, the working efficiency can be improved by the use of an apparatus such as the foregoing composite type electrical connection film-forming apparatus 100, in which a series of steps including the barrier film-forming step and those carried out before and after the barrier film-forming step, or the degassing step and the electrical connection film-forming steps can be carried out in such a single or the same apparatus.

In this connection, the foregoing composite type electrical connection film-forming apparatus 100 is so designed that the pre-treatment section 101 comprises one each of the degassing chamber 101c and the reduction-treating chamber 101d, while the film-forming section 103 comprises one each of the film-forming chamber 103b and the electrical connection film-forming chamber 103c, but the construction of the apparatus 100 is not restricted to this structure.

Accordingly, for instance, the pre-treatment section 101 and the film-forming section 103 may be so designed as to have polygonal shapes, and a plurality of degassing chambers 101c and reduction-treating chambers 101 and a plurality of film-forming chambers 103b and electrical connection film-forming chambers 103c may be arranged on each face, respectively and accordingly, this leads to a further improvement of the throughput capacity of the apparatus.

EXAMPLE 1

In this Example, a tantalum nitride film was prepared using the film-forming apparatus 1 shown in FIG. 1 and using penta-dimethylamino-tantalum (MO) gas as the raw gas, $NH_3$ gas and $NH_3$ gas as the H atom-containing gas.

After the surface of a substrate S provided thereon with an $SiO_2$ insulating film was subjected to a pre-treatment or a degassing treatment according to a known method, the substrate S was introduced into the vacuum chamber 1 which had been vacuum-evacuated to a pressure of not more than $10^{-5}$ Pa by putting the vacuum evacuation system 2 into operation. The substrate used herein is not limited to any particular one, and it may be, for instance, one prepared by applying a voltage to a target, which comprises Ta as a principal constituent, while using Ar gas as a sputtering gas, to thus generate plasma and then sputtering the target according to the usual sputtering technique to thus form an adhesive layer on the side of the substrate.

After the substrate S was conveyed into the vacuum chamber 1 and the substrate S was placed on the substrate-mounting stage 6, it was heated to a temperature of 250° C. with the heater 5. Subsequently, the foregoing raw gas and the foregoing $NH_3$ gas were supplied to the gas chamber 7 through the gas-introducing system 9, at flow rates of 5 sccm and 100 sccm, respectively, in such a manner that they were guided towards the surface of the substrate S, through the hole 8.

After establishing a predetermined stable pressure within the vacuum chamber 1, a high frequency power source 4 was put into operation to thus make, output, a high frequency AC voltage having a frequency of 27.12 MHz and a power density of 0.2 $W/cm^2$, so that the plasma of the raw gas and the $NH_3$ gas was generated between the electrode 3 and the surface of the substrate S. The radicals of these raw gas and $NH_3$ gas were generated within the plasma and a reduction reaction was induced on the surface of the substrate S and this resulted in the formation of a film composed of a reduced compound having Ta—N—$NH_3$ bonds. After the formation of the reduced compound film having a desired film thickness, the high frequency power source 4 was switched off and the supply of the raw gas and $N_2$ and H atom-containing gas was stopped.

Then, a hydrogen atom-containing gas was introduced into the vacuum chamber 1 through the gas-introducing system 9 and the procedures used above were repeated to thus generate plasma within the chamber and the radicals generated in the plasma were incident upon the surface of the reduced compound film formed above to thus make them react with one another. This led to the cleavage of Ta—N bonds present in the reduced compound film to remove the R(R') groups, which is bonded to N atoms, remaining in the film through cleavage thereof. As a result, a tantalum nitride film rich in tantalum was formed. After the formation of a tantalum nitride film having a desired film thickness, the high frequency power source 4 was switched off, the introduction of the hydrogen atom-containing gas was stopped and the substrate S was withdrawn from the vacuum chamber 1.

The barrier film thus formed was inspected for its composition and as a result, the following results were obtained: the ratio: Ta/N: 1.9; the content of C: not more than 5%; and the content of N: 35%.

By way of comparison, the procedures similar to those used above were repeated except for using a combination of the foregoing raw gas (MO gas) and an $NH_3$ gas or a combination of the foregoing raw gas and a reactant gas (H radicals), to thus form a comparative film.

The specific resistance (resistivity) $\rho$ ($\mu\Omega\cdot cm$) was calculated for each of the thin films prepared according to the foregoing methods. More specifically, the resistivity was obtained by measuring the sheet resistance (Rs) according to the four point probe method and determining the film thickness (T) by the SEM, followed by the substitution of these data in the following relation: $\rho = Rs \cdot T$.

The film prepared by reducing the raw gas (MO gas) with $NH_3$ gas and then reacting the reduced product with H radicals by the introduction of the H atom-containing gas (H radicals) was found to have a resistivity value (600$\mu\Omega\cdot cm$), lower than that (2000$\mu\Omega\cdot cm$) observed for the film prepared using MO gas and H radicals and that (about 5000$\mu\Omega\cdot cm$) observed for the film prepared using MO gas and $NH_3$ gas.

It would be concluded as follows: the foregoing results indicate that the formation of a film through the reaction of MO gas with H radicals never permits any sufficient removal of R (alkyl groups) or the removal of C and thus the resulting film does not have a satisfactorily reduced resistivity, while it is quite difficult to form a tantalum nitride film rich in tantalum through the reaction of MO gas with $NH_3$ gas.

On the other hand, it would be concluded as follows: the foregoing results indicate that, when forming a film using MO gas, $NH_3$ gas and H atom-containing gas, the Ta—N bonds in the raw gas molecules are first partially broken by the action of $NH_3$ and then the linkages between Ta atoms and nitrogen atoms present in the reduced compound having a high resistance value are likewise broken by the action of the hydrogen radicals supplied so that the R(R') groups (alkyl groups) remaining on the compound are eliminated and that the contents of C and N atoms are thus reduced and that the resulting film is accordingly rich in tantalum atom and has a reduced specific resistance.

As has been described above, the substrate which has been provided thereon with the tantalum nitride film or the barrier layer having a desired thickness may, if necessary, further be treated by applying a voltage to a target, while using Ar gas as a sputtering gas, to thus generate plasma, then sputtering the target according to the usual sputtering technique to thus form a metal thin film or an adhesive layer on the side of an electrical connection-forming film serving as an underlying layer on the surface of the barrier film.

A Cu-electrical connection-forming film was applied, under the known process conditions, onto the substrate S provided thereon with the laminated film thus formed or on the adhesive layer on the side of the barrier film, if such an adhesive layer had been formed on the substrate. In this respect, it was confirmed that the adhesiveness between each neighboring films was excellent.

EXAMPLE 2

In this Example, tantalum particles were implanted into the tantalum nitride film prepared in Example 1 using a known sputtering device to thus form a tantalum nitride film richer in the tantalum content.

Ar gas as the sputtering gas was introduced into the sputtering device while inducing discharges through the application of an electric voltage through the voltage-applying device to generate plasma within the chamber and the target mainly comprising tantalum was then sputtered to thus implant tantalum particles as the sputtered particles in the thin film formed on the substrate S. The sputtering procedures were carried out under the following conditions: DC power: 5 kW; RF power: 600 W. In addition, the sputtering temperature was set at a level ranging from −30 to 150° C.

Thus, the implantation of the tantalum-containing particles into the thin film through the sputtering technique permitted a further increase in the content of tantalum in the barrier film to thus give a tantalum nitride film rich in tantalum and having a desired low resistance value. In this respect, the decomposition of the thin film was accelerated and impurities such as C and N were expelled from the barrier film by the impact of such tantalum particles on the surface of the substrate S and as a result, this resulted in the formation of a low resistant barrier film having a quite low content of impurities. The thin film thus formed was inspected for a variety of properties thereof and it was found that the ratio: Ta/N was 3.5 and the content of C was not more than 0.1% and that of N was 22%. In addition, the resulting thin film had a specific resistance value of 90μΩ·cm.

After the formation of such a modified tantalum nitride film having a desired thickness according to the foregoing procedures, it is, if necessary, also possible that a sputtering gas such as Ar gas is introduced into the chamber and a voltage is applied to the target by the operation of the voltage-applying device to thus generate plasma and then the target is sputtered according to the known film-forming process conditions of the sputtering technique to thus form a metal thin film or an adhesive layer on the side of the electrical connection-forming film as an underlying layer on the surface of the barrier film.

A Cu-electrical connection-forming film was applied, under the known process conditions, onto the substrate S provided thereon with the laminated film thus formed according to the foregoing steps or on the adhesive layer on the side of the electrical connection-forming film. In this respect, it was confirmed that the adhesiveness between each neighboring films was excellent.

EXAMPLE 3

The same film-forming procedures used in Example 1 were repeated except that tert-amylimido-tris(dimethylamino) tantalum was substituted for the penta-dimethylamino-tantalum as the raw gas used in Example 1 to thus form a low-resistant tantalum nitride film rich in tantalum. The resulting film was inspected for a variety of properties thereof and it was found that the ratio: Ta/N was 1.8 and the content of C was 5% and that of N was 35.7%. In addition, the resulting thin film had a specific resistance value of 700μΩ·cm.

EXAMPLE 4

The same film-forming process used in Example 1 was repeated except that $H_2$ gas was used in place of the reactant gas for the generation of H radicals and as a result, the same results observed in Example 1 were likewise obtained in this Example.

INDUSTRIAL APPLICABILITY

The present invention permits the formation, according to the CVD technique, of a tantalum nitride film having a low resistance, whose contents of C and N atoms are low, which has a high compositional ratio: Ta/N, which can ensure sufficiently high adherence to a Cu film and which is thus useful as a barrier film. Accordingly, the present invention can be applied to the thin film-forming process in the field of the semiconductor device.

DESCRIPTION OF SYMBOLS

Figure 1:
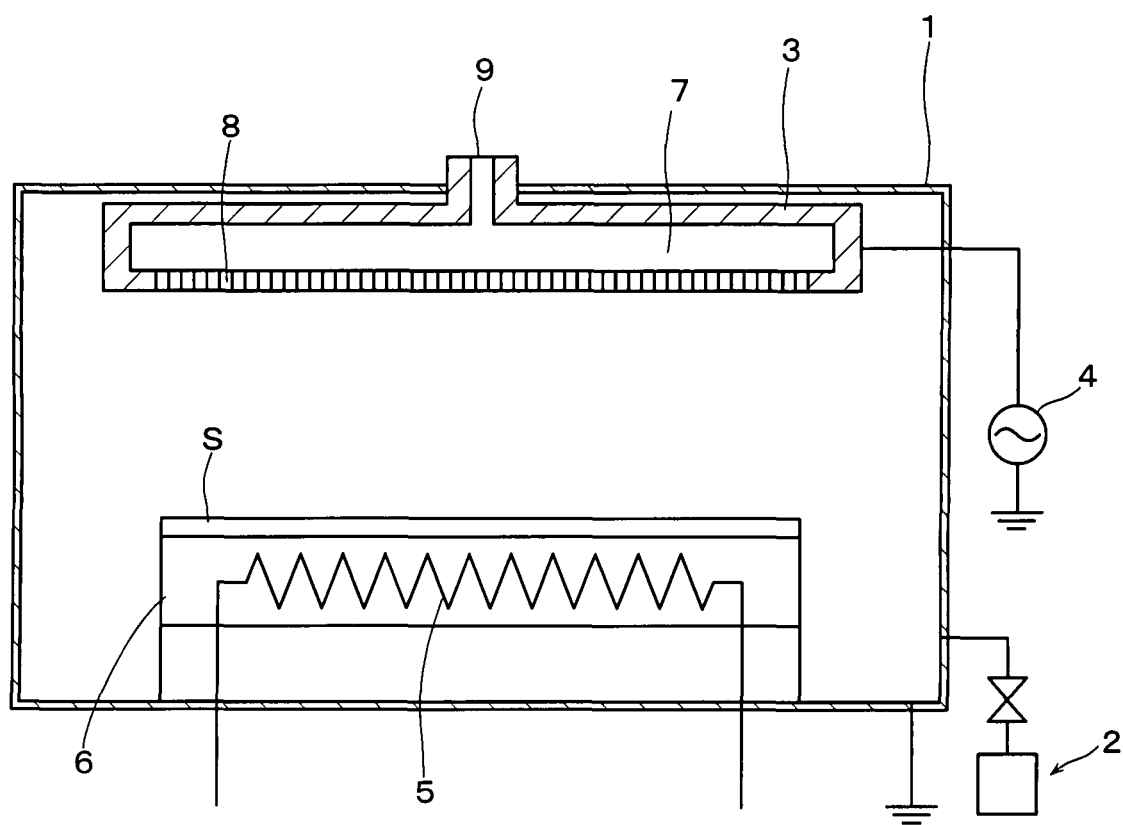
FIG. 1 is a schematic block diagram for illustrating an embodiment of a film-forming apparatus used for practicing the film-forming method according to the present invention.
Figure 2:
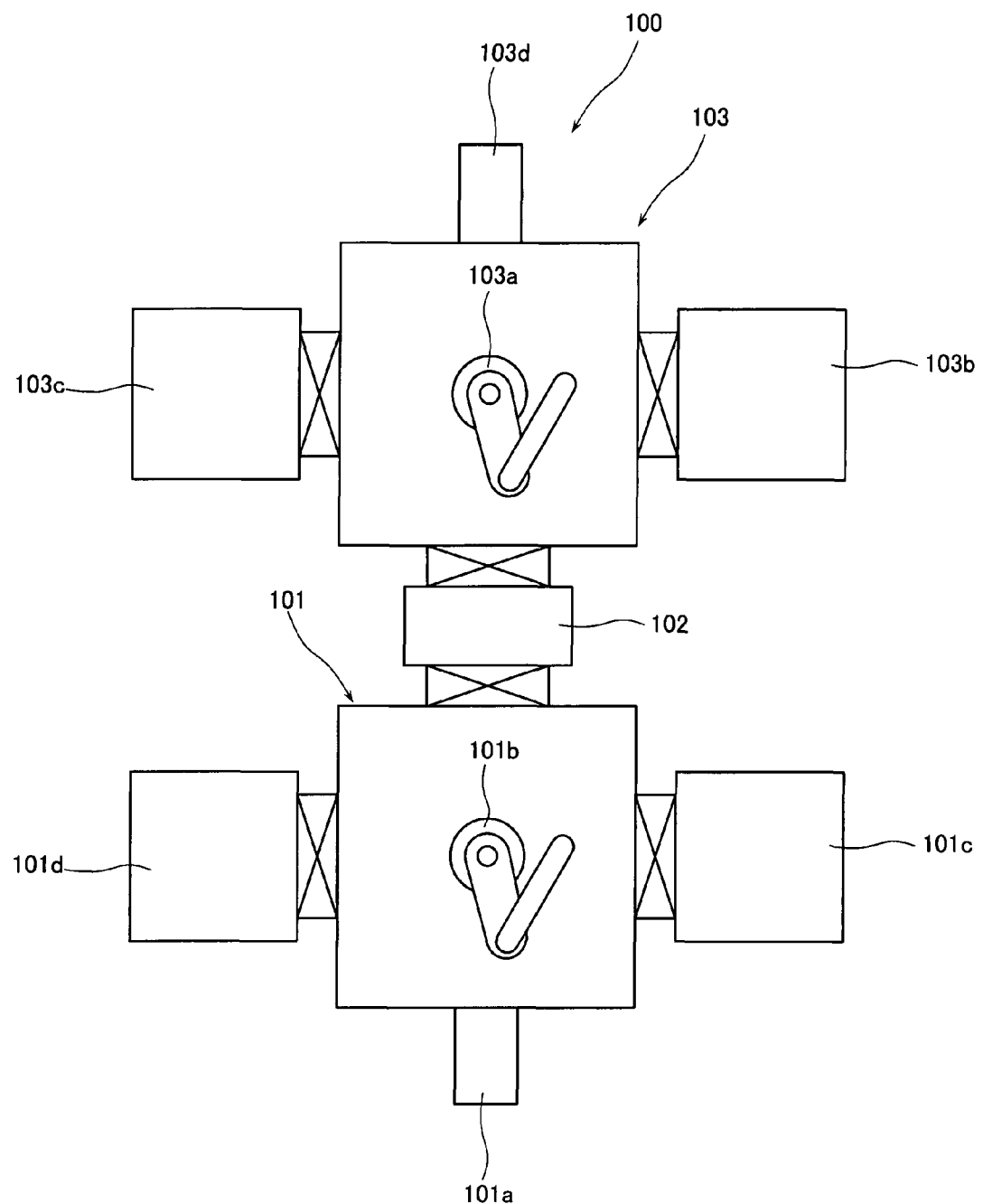
FIG. 2 is a schematic block diagram for illustrating a composite type electrical connection film-forming apparatus provided with a film-forming apparatus, incorporated into the same, used for carrying out the film-forming method according to the present invention.

1 . . . Vacuum chamber; 2 . . . Vacuum evacuation system; 3 . . . Electrode; 4 . . . High frequency power source; 5 . . . Heating means; 6 . . . Substrate-mounting stage; 7 . . . Gas chamber; 8 . . . Hole; 9 . . . Gas-introducing system; S . . . Substrate.

What is claimed is:

1. A method for forming a tantalum nitride film comprising the steps:

using a composite type electrical connection film-forming apparatus equipped with a film-forming section comprising:
a film-forming chamber,
a sputtering device, and
an electrical connection film-forming chamber;
simultaneously introducing a raw gas comprising
a coordination compound comprising an elemental tantalum (Ta) having a coordinated ligand representable by the general formula: N=(R, R'), and
$NH_3$ gas
into a film-forming chamber;
wherein R and R' may be the same or different and each represents an alkyl group having 1 to 6 carbon atoms,
reducing the raw gas with $NH_3$ gas and forming a reduced compound film on a substrate to thus partially remove the R or R' groups bonded to the N atoms in the reduced compound film;
then introducing a hydrogen atom-containing gas without the raw gas into the chamber;
reacting the hydrogen atom-containing gas with the reduced compound film to form a tantalum nitride film rich in tantalum atoms;
implanting tantalum particles into the resulting tantalum nitride film according to a sputtering technique which makes use of a target containing tantalum as a principal constituent, while controlling a DC power and an RF power in such a manner that the DC power is set at a level of not more than 5 kW and the RF power is set at a value ranging from 400 to 800 W; and
forming an electrical connection-film, in the electrical connection film-forming chamber, on the tantalum nitride film thus obtained.

2. The method for forming a tantalum nitride film as set forth in claim 1, wherein
the hydrogen atom-containing gas is converted into radicals thereof by an action of heat or plasma within the film-forming chamber; and
the resulting radicals are reacted with the reduced compound film to thus form a tantalum nitride film rich in tantalum atoms.

3. The method for forming a tantalum nitride film as set forth in claim 1, wherein
the raw gas is a gas comprising at least one coordination compound selected from the group consisting of penta-dimethylamino-tantalum, tert-amylimido-tris(dimethyl-amide) tantalum, penta-diethyl-amino-tantalum, tert-butylimido-tris(dimethylamide) tantalum, tert-butyl-imido-tris((ethyl-methyl-amide) tantalum, $Ta(N(CH_3)_2)_3(N(CH_2CH_3)_2)_2$ and $TaX_5$,
wherein X represents a halogen atom.

4. The method for forming a tantalum nitride film as set forth in claim 1, wherein
   the hydrogen atom-containing gas is at least one gas selected from the group consisting of $H_2$, $NH_3$ and $SiH_4$.

5. The method for forming a tantalum nitride film as set forth in claim 1, wherein
   a compositional ratio of tantalum to nitrogen in the tantalum nitride film satisfies $Ta/N \geq 2.0$.

6. The method for forming a tantalum nitride film as set forth in claim 1, wherein
   a compositional ratio of tantalum to nitrogen in the tantalum nitride film, in which the tantalum particles are implanted, $Ta/N \leq 2.0$.

7. The method for forming a tantalum nitride film as set forth in claim 1, wherein
   after implanting the tantalum particles, an adhesive layer is formed on the tantalum nitride film in the sputtering device and the electrical connection-film is formed, in the electrical connection film-forming chamber, on the adhesive layer.

* * * * *

UNITED STATES PATENT AND TRADEMARK OFFICE
CERTIFICATE OF CORRECTION

| | | |
|---|---|---|
| PATENT NO. | : 8,796,142 B2 | Page 1 of 1 |
| APPLICATION NO. | : 11/885345 | |
| DATED | : August 5, 2014 | |
| INVENTOR(S) | : Narishi Gonohe | |

It is certified that error appears in the above-identified patent and that said Letters Patent is hereby corrected as shown below:

On the title page item (86) should read:

(86) PCT No.:   PCT/JP2006/304072

Signed and Sealed this
Twentieth Day of January, 2015

Michelle K. Lee
*Deputy Director of the United States Patent and Trademark Office*